United States Patent
Huang et al.

(10) Patent No.: US 8,603,574 B2
(45) Date of Patent: Dec. 10, 2013

(54) CURVED TOUCH SENSOR

(75) Inventors: Lili Huang, San Jose, CA (US); Seung Jae Hong, Sunnyvale, CA (US); John Z. Zhong, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 388 days.

(21) Appl. No.: 12/940,544

(22) Filed: Nov. 5, 2010

(65) Prior Publication Data
US 2012/0111491 A1 May 10, 2012

(51) Int. Cl.
*H05K 3/00* (2006.01)
(52) U.S. Cl.
USPC .................... 427/162; 427/98.2; 349/159
(58) Field of Classification Search
USPC ............... 349/158, 110; 427/58, 98.2, 162
See application file for complete search history.

(56) References Cited

U.S. PATENT DOCUMENTS

| | | | |
|---|---|---|---|
| 5,188,692 A * | 2/1993 | Horvath | ...................... 156/212 |
| 5,483,261 A | 1/1996 | Yasutake | |
| 5,488,204 A | 1/1996 | Mead et al. | |
| 5,825,352 A | 10/1998 | Bisset et al. | |
| 5,835,079 A | 11/1998 | Shieh | |
| 5,880,411 A | 3/1999 | Gillespie et al. | |
| 6,188,391 B1 | 2/2001 | Seely et al. | |
| 6,310,610 B1 | 10/2001 | Beaton et al. | |
| 6,323,846 B1 | 11/2001 | Westerman et al. | |
| 6,690,387 B2 | 2/2004 | Zimmerman et al. | |
| 7,015,894 B2 | 3/2006 | Morohoshi | |
| 7,184,064 B2 | 2/2007 | Zimmerman et al. | |
| 7,663,607 B2 | 2/2010 | Hotelling et al. | |
| 8,479,122 B2 | 7/2013 | Hotelling et al. | |
| 2003/0030760 A1* | 2/2003 | Nishiki | ........................ 349/43 |
| 2006/0026521 A1 | 2/2006 | Hotelling et al. | |
| 2006/0197753 A1 | 9/2006 | Hotelling | |
| 2007/0045264 A1* | 3/2007 | Nekoda et al. | ................ 219/203 |
| 2009/0273584 A1* | 11/2009 | Staton et al. | .................. 345/178 |
| 2010/0103138 A1* | 4/2010 | Huang et al. | .................. 345/174 |

FOREIGN PATENT DOCUMENTS

| | | |
|---|---|---|
| JP | 2000-163031 A | 6/2000 |
| JP | 2002-342033 A | 11/2002 |

OTHER PUBLICATIONS

Lee, S.K. et al. (Apr. 1985). "A Multi-Touch Three Dimensional Touch-Sensitive Tablet," *Proceedings of CHI: ACM Conference on Human Factors in Computing Systems*, pp. 21-25.

(Continued)

*Primary Examiner* — Michael Cleveland
*Assistant Examiner* — Tabassom Tadayyon Eslami
(74) *Attorney, Agent, or Firm* — Morrison & Foerster LLP (57) ABSTRACT

A method of forming a curved touch surface is disclosed. The method can include depositing and patterning a conductive thin film on a flexible substrate to form at least one touch sensor pattern, while the flexible substrate is in a flat state. According to certain embodiments, the method can include supporting the flexible substrate in the flat state on at least one curved forming substrate having a predetermined curvature; and performing an anneal process, or an anneal-like high-heat process, on the conductive thin film, wherein the anneal process can cause the flexible substrate to conform to the predetermined curvature of the at least one curved forming substrate. According to an embodiment, the curved forming substrate can include a first forming substrate having a first predetermined curvature and a second forming substrate having a second predetermined curvature complementing the first predetermined curvature.

19 Claims, 5 Drawing Sheets

(56) References Cited

OTHER PUBLICATIONS

Rubine, D.H. (Dec. 1991). "The Automatic Recognition of Gestures," CMU-CS-91-202, Submitted in Partial Fulfillment of the Requirements of the Degree of Doctor of Philosophy in Computer Science at Carnegie Mellon University, 285 pages.

Rubine, D.H. (May 1992). "Combining Gestures and Direct Manipulation," Chi ' 92, pp. 659-660.

Westerman, W. (Spring 1999). "Hand Tracking, Finger Identification, and Chordic Manipulation on a Multi-Touch Surface," A Dissertation Submitted to the Faculty of the University of Delaware in Partial Fulfillment of the Requirements for the Degree of Doctor of Philosophy in Electrical Engineering, 364 pages.

* cited by examiner

CURVED TOUCH SENSOR

FIELD

This relates generally to the formation of touch sensors, and in particular, to forming touch sensors having a curved flexible substrate.

BACKGROUND

Recently, input devices using touch sensors, such as track pads, touch screens and the like, have become increasingly popular. In portable computing devices such as laptop computers, the input devices are commonly track pads (also known as touch pads). With a track pad, the movement of an input pointer (i.e., cursor) usually corresponds to the relative movements of the user's finger (or stylus) as the finger is moved along a surface of the track pad.

In the case of hand-held personal digital assistants (PDA) or mobile devices, the input devices tend to utilize touch-sensitive display screens. When using a touch screen, a user can make a selection on the display screen by pointing directly to objects on the screen using a stylus or finger. Touch screens can include a touch sensor panel, which can be a clear panel with a touch-sensitive surface, and a display device such as a liquid crystal display (LCD) that can be positioned partially or fully behind the panel, or integrated with the panel, so that the touch-sensitive surface can cover at least a portion of the viewable area of the display device. Touch screens can allow a user to perform various functions by touching the touch sensor panel using a finger, stylus or other object at a location often dictated by a user interface (UI) being displayed by the display device. In general, touch screens can recognize a touch event and the position of the touch event on the touch sensor panel, and the computing system can then interpret the touch event in accordance with the display appearing at the time of the touch event, and thereafter can perform one or more actions based on the touch event.

Touch sensor panels can generally be very thin, and can include a substrate with a thin patterned film laminated (or otherwise deposited or formed) thereon. However, due to the desired thinness of the substrate and thin film, difficulties can occur during fabrication due to the risk of damaging components of the touch sensor panel.

For example, when flexible substrates are processed by depositing the thin film, the transition temperature, at which point the substrate can warp or deform, may be relatively low. Generally, any processing of a flexible plastic substrate, for example, has to be below 150° C. or else it can deform. However, annealing the thin film at a high temperature (above 150° C.) is often desired, since it can improve the thin film's resistivity and optical properties. Hence, annealing the thin film while adhered to the flexible plastic substrate can cause an unwanted deformation in the substrate.

SUMMARY

Presently disclosed embodiments are directed to solving issues relating to one or more of the problems presented in the prior art, as well as providing additional features that will become readily apparent by reference to the following detailed description when taken in conjunction with the accompanying drawings.

This relates to the formation of touch sensors having curved substrates. Embodiments described herein are directed to a method of forming a touch surface, where a conductive thin film can be deposited and patterned on a flexible substrate to form a touch sensor pattern, while the flexible substrate is in a flat state. Thereafter, the flexible substrate in the flat state can be joined to at least one curved forming substrate having a predetermined curvature. A high-temperature anneal can be performed on the conductive thin film (deposited on the flexible substrate), which can cause the flexible substrate to conform to the predetermined curvature of the at least one curved forming substrate.

Embodiments described herein are directed to a method of forming a curved touch surface. The method can include depositing and patterning a conductive thin film on a flexible substrate to form at least one touch sensor pattern, while the flexible substrate is in a flat state. According to certain embodiments, the method can include supporting the flexible substrate in the flat state on at least one curved forming substrate having a predetermined curvature; and performing an anneal process, or an anneal-like high-heat process, on the conductive thin film, wherein the anneal process can cause the flexible substrate to conform to the predetermined curvature of the at least one curved forming substrate.

According to an embodiment, the at least one curved forming substrate can include a first forming substrate having a first predetermined curvature and a second forming substrate having a second predetermined curvature complementing the first predetermined curvature.

By depositing and patterning thin film, for example, on substrate while in a flat state, and then annealing, for example, the thin film when the substrate is joined to a forming substrate, the substrate can be curved to a desired curvature. Further, thin film can receive the benefits of the annealing process, such as increased strength and conductivity and enhanced optical properties, without undesired warping or deformation to the substrate.

BRIEF DESCRIPTION OF THE DRAWINGS

The present disclosure, in accordance with one or more various embodiments, is described in detail with reference to the following figures. The drawings are provided for purposes of illustration only and merely depict exemplary embodiments of the disclosure. These drawings are provided to facilitate the reader's understanding of the disclosure and should not be considered limiting of the breadth, scope, or applicability of the disclosure. It should be noted that for clarity and ease of illustration these drawings are not necessarily made to scale.

DETAILED DESCRIPTION

In the following description of embodiments, reference is made to the accompanying drawings which form a part hereof, and in which it is shown by way of illustration specific embodiments that can be practiced. It is to be understood that other embodiments can be used and structural changes can be made without departing from the scope of the disclosed embodiments.

This relates to the formation of touch sensors having curved substrates. Embodiments described herein are directed to a method of forming a touch surface, where a conductive thin film can be deposited and patterned on a flexible substrate to form a touch sensor pattern, while the flexible substrate is in a flat state. Thereafter, the flexible substrate in the flat state can be joined to at least one curved forming substrate having a predetermined curvature. A high-temperature anneal can be performed on the conductive thin film (deposited on the flexible substrate), which can cause the flexible substrate to conform to the predetermined curvature of the at least one curved forming substrate.

By depositing and patterning the thin film on a flexible substrate while in a flat state, and then annealing the thin film when the substrate is joined to a forming substrate, the flexible substrate can be conformed to a desired curvature. Further, the thin film can receive the benefits of the annealing process, such as increased strength and conductivity, and enhanced optical properties, without undesired warping or deformation of the flexible substrate.

Figure 1:
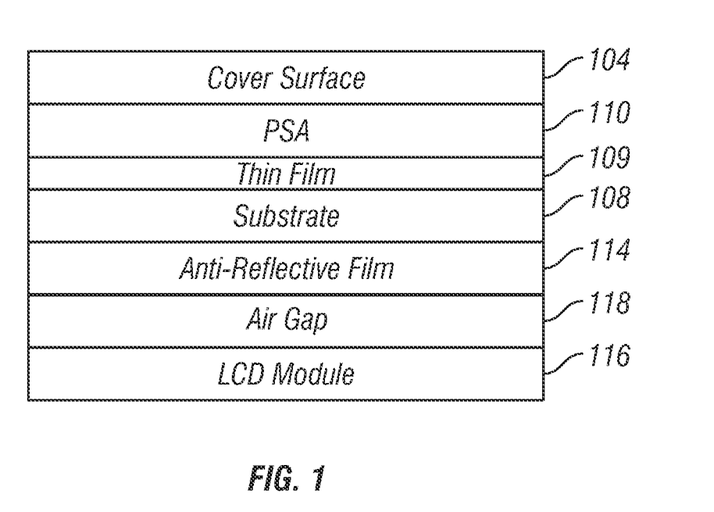
FIG. 1 illustrates an exemplary touch sensor panel stackup, according to one embodiment described herein.

FIG. 1 illustrates an exemplary touch screen stackup, including a touch sensor panel with drive and sense electrodes formed with a thin film layer deposited on substrate, according to various embodiments. Touch surfaces, such as capacitive sensing surfaces, generally contain several layers of material. For example, the capacitive sensing surface can include a protective/cosmetic shield (e.g., a cover glass 104 or other dielectric material), one or more electrode layers and a substrate 108. The protective shield (cover glass 104) is the part of the capacitive sensing surface that can be touched by the user to perform functions such as control operations, gestures, or cursor movements on a display screen, for example. The protective shield can cover the electrode layer (s), and the electrode layer(s) can be formed on the substrate 108 by depositing thin film 109 thereon. The substrate may be, for example, glass, polyethylene-terephthalate (PET), polymide, polycarbonate, or any plastic or flexible substrate.

Capacitive sensing surfaces as described herein can refer to a track pad, touch mouse, touch screen, or any other touch-sensitive surface. For exemplary purposes, various embodiments are described with reference to a touch sensor incorporated within a touch screen. It is noted, however, that the processes described herein can be implemented for various other devices equipped with one or more touch sensors.

In the case of the touch sensor being incorporated within a touch screen, the thin film material used to form the drive and sense electrodes can be a substantially transparent conductive material, such as Indium Tin Oxide (ITO) or Antimony Tin Oxide (ATO), for example. However, the thin film 109 can be any other transparent or non-transparent conductive materials, such as silver ink, copper, $SiO_2$, or the like. Thin film 109 can be laminated to substrate 108; however, other than applying ITO, or any other layer, via thin film 109, the ITO can be deposited using a sputtering process, a lithography etch, or any other deposition technique.

Thin film 109 can include one or more electrode layers having a matrix of drive and sense electrodes of a conductive material. Drive signals can be transmitted through the drive electrodes, resulting in signal (mutual) capacitances between the drive and sense electrodes at the intersection (touch pixels) of the drive electrodes and the sense electrodes. Sensing electronics can be adapted to detect the change in capacitance at each of the sense electrodes as a finger or other object passes over or contacts the touch surface. The capacitance between drive and sense electrodes can appear as a stray capacitance when the given row is held at direct current (DC) voltage levels and as a mutual signal capacitance Csig when the given row is stimulated with an alternating current (AC) signal. The presence of a finger or other object near or on the touch sensor panel can be detected by measuring changes to a signal charge present at the touch pixels being touched, which is a function of Csig. The resulting change in signal capacitance is recognized by the sensing electronics to indicate that a finger or other object has contacted (or is in proximity to) the touch surface at a known pixel. Although embodiments herein are described with respect to mutual capacitance, other touch sensing mechanisms can be employed, such as self capacitance, for example.

The sensing electronics can include an application specific integrated circuit (ASIC) that can be configured to detect a change in capacitance at each of the electrodes and to compute the position of finger movement based on the change in capacitance over time at each of the sense electrodes. The ASIC can also be configured to report this information to other logic within the computing device, such as a host processor.

Substrate 108 of the type described above, with a thin film 109 forming patterned drive electrodes and sense electrodes, can be bonded to the cover glass (or other material, such as plastic) 104 with pressure sensitive adhesive (PSA) 110. An unpatterned layer of ITO (not shown) can optionally be formed on the bottom of the substrate 108 to act as a shield. Anti-reflective (AR) film 114 can then be deposited over unpatterned ITO 112. LCD module 116 can then be placed beneath the substrate 108, optionally separated by air gap 118 for ease of repair. Of course, various combinations of the layers of materials depicted in FIG. 1, or completely different layers, can be used without departing from the scope of the present disclosure. For example, instead of an air gap 118, an adhesive layer or a layer of AR file 114 can be included. Also, the thin film 109 can be formed and patterned below the substrate 108 (single-sided ITO), or on both sides (double-sided ITO), according to various embodiments.

Figure 2A:
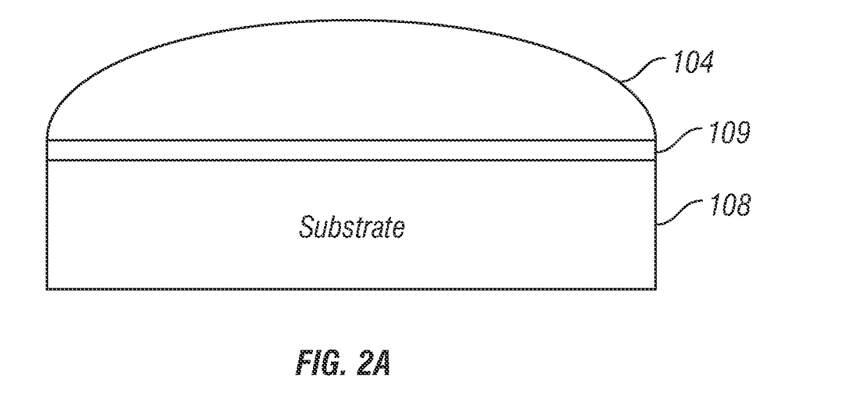
FIG. 2A illustrates a touch sensor panel with a curved cover glass, according to one embodiment described herein.

Depending on design preferences, touch sensor panels can take various shapes and/or curvatures. For example, touch sensor panels can have a convex or concave curvature along either the x or y axis, or both axes, or can be completely spherical. FIG. 2A shows an exemplary stackup, including (for simplicity) substrate 108, thin film 109 and cover glass 104, where the cover glass is curved. Accordingly, the touch sensor can have a visual effect of being convex with respect to the user. Since the substrate remains flat in the convex design of FIG. 2A, the overall thickness of the touch sensor panel can be greater than if the cover glass 104 is also flat, as shown in FIG. 1. Moreover, capacitive sensing at the sense electrodes formed with thin film 109 can be degraded, due to the greater distance between a user's finger contacting the cover glass 104, for example, and the drive and sense electrodes (i.e., the greater distance between cover glass 104 and thin film 109). As noted above, the thin film 109 can be formed and patterned above or below the substrate 108 (single-sided ITO), or on both sides (double-sided ITO), according to various embodiments.

Figure 2B:
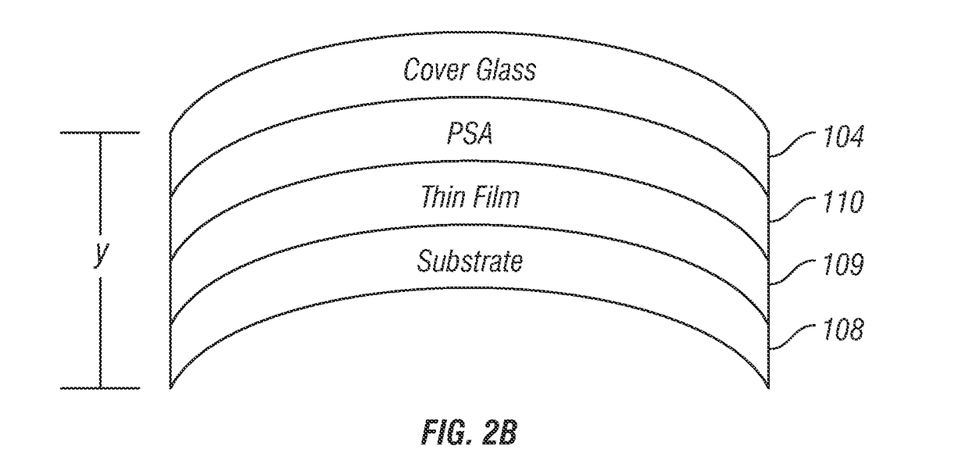
FIG. 2B illustrates a constant wall touch sensor panel, according to one embodiment described herein.

FIG. 2B illustrates a constant wall touch sensor panel, according to one embodiment described herein. In other words, the thickness "y" of the touch sensor panel remains constant, since the substrate 108 is curved to a substantially similar degree as the cover glass 104. Using the constant wall design as shown in FIG. 2B, the overall thickness of the touch sensor panel can be less than the design shown in FIG. 2A, while touch sensitivity can remain high, since the distance between cover glass 104 and thin film 109 is unchanged from that of the completely flat stackup of FIG. 1, for example. However, it is thus required to form the touch sensor with a curved substrate 108. As noted above, the thin film 109 can be formed and patterned above or below the substrate 108 (single-sided ITO), or on both sides (double-sided ITO), according to various embodiments.

Figure 3:
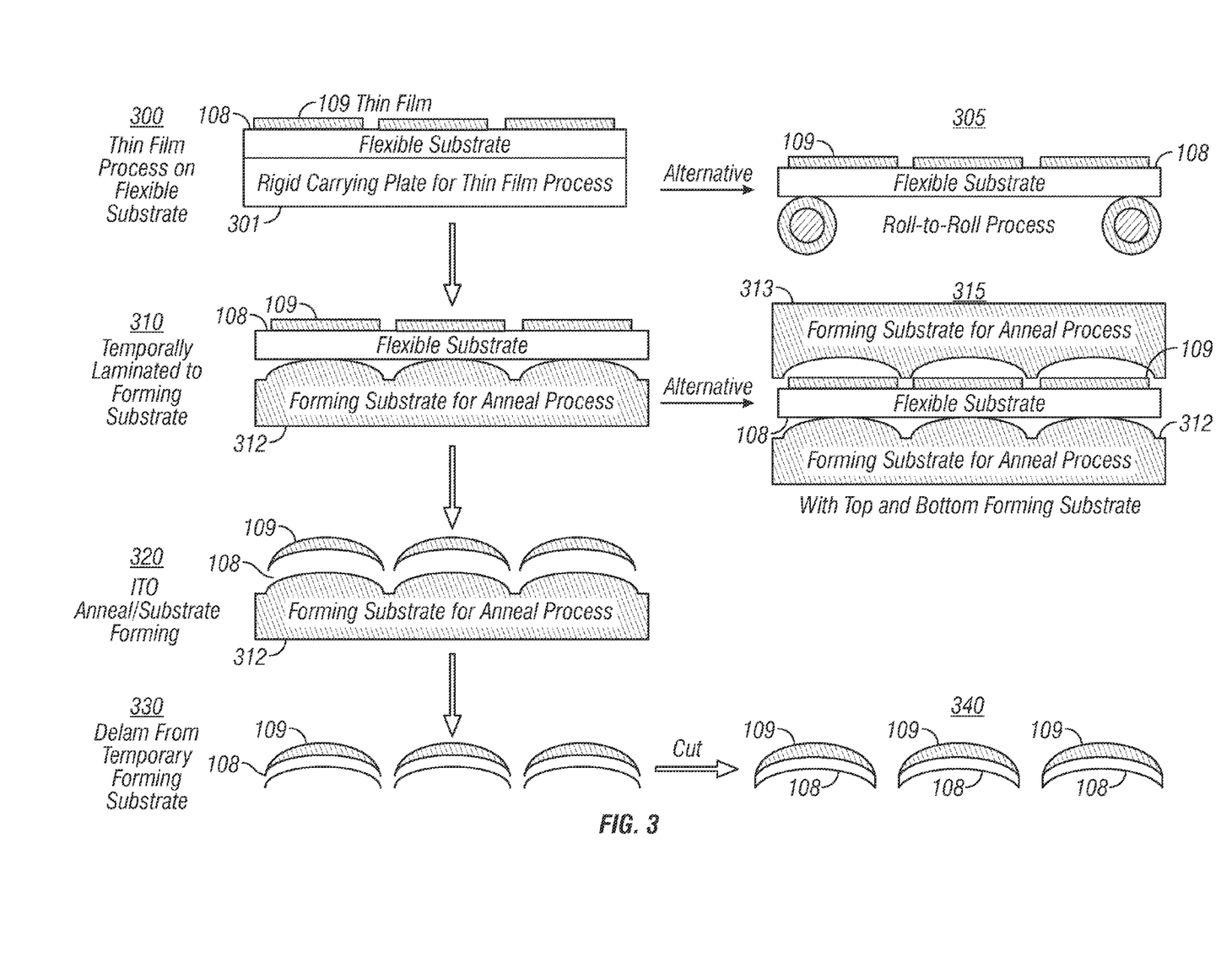
FIG. 3 illustrates an exemplary process of forming a touch sensor with a curved substrate, according to one embodiment described herein.

FIG. 3 illustrates an exemplary process of forming a touch sensor with a curved substrate 108, according to one embodiment described herein. Referring to FIG. 3, at process 300 thin film 109 can be deposited (e.g., laminated) to substrate 108. Thin film 109 can be patterned to form the touch sensor pattern of drive and sense electrodes. According to one embodiment, the processing of thin film 109 can occur while substrate 108 is flat, and resting (or otherwise attached) to a rigid carrying plate 301. All processing of thin film 109 at operation 300 can be performed at a low temperature (i.e., below 150° C.) in order to avoid deformation of substrate 108. As an alternative, operation 305 shows a roll-to-roll process where the thin film 109 processing can similarly be performed while substrate 108 remains flat, and at a low temperature.

From operation 300 or 305, the process can continue to operation 310, where the substrate 108 can be removed (e.g., delaminated) from rigid carrying plate 301 and joined with, or supported on, forming substrate 312. Forming substrate 312 can be any material that can withstand high temperatures without deforming. Forming substrate 312 can include any number of predetermined curvatures that are used to shape substrate 108. Substrate 108 can be joined to forming substrate 312 by being temporarily laminated, or can merely rest on forming substrate 312.

From operation 310, the process continues to operation 320, where annealing or a similar process can be performed for the thin film 109 (e.g., ITO). In some embodiments, annealing can refer to a process of providing a heat treatment to the thin film 109, causing changes in its properties, although treatments other than high heat can also be used, such as chemical treatments. However, other anneal-like processes can be executed, such as high-pressure or UV exposure processes. In the case of the thin film 109 being ITO, annealing can substantially crystallize the ITO providing strength and an increased conductivity. Moreover, when forming a touch sensor to be incorporated within a display device, for example, annealing can provide enhanced optical properties, such as clarity, so that the thin film 109 is not visible in the display device.

During the anneal process, the substrate 108 can flex due to the high heat, so that it can conform to the curvature of forming substrate 312. Gravity, for example, can provide a sufficient force to press the flexible substrate 108 against forming substrate 312 so that substrate 108 can conform to the predetermined curvatures thereof. As an alternative depicted in operation 315, a second forming substrate 313, with one or more complementary curvatures to those of the first forming substrate 312 can be used to provide further pressure, forcing substrate 108 to conform to the complementary curvatures of both forming substrates 312 and 313.

From operation 320, the process continues to operation 330, where the substrate 108 is removed (e.g., delaminated) from forming substrate 312. At operation 340, the curved substrates 108 including thin film 109 can be cut and separated. In this exemplary process, three touch sensors are formed on three curved substrates 108. However, it should be noted that any number of curved substrates can be formed by the cutting and separation process.

By depositing and patterning thin film 109 on substrate 108 while in a flat state, and then annealing the thin film 109 when the substrate 108 is joined to a forming substrate 312 (and 313, according to an embodiment), the substrate 108 can be curved to a desired curvature. Further, thin film 109 can receive the benefits of the annealing process, such as increased strength and conductivity and enhanced optical properties, without undesired warping or deformation to substrate 108.

Figure 4A:
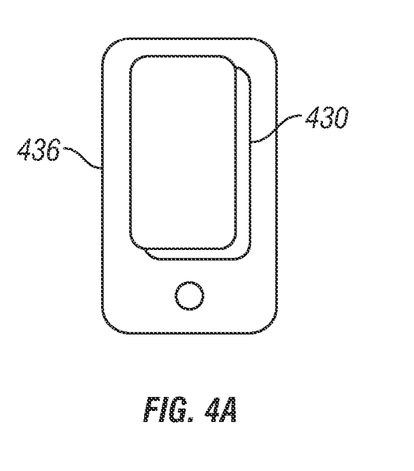
FIG. 4A illustrates an exemplary mobile telephone that can include a touch sensor with a curved substrate, according to the various embodiments described herein.

FIG. 4A illustrates exemplary mobile telephone 436 including a touch screen device 430, the touch screen device 430 including a touch sensor formed with a curved substrate, according to one disclosed embodiment.

Figure 4B:
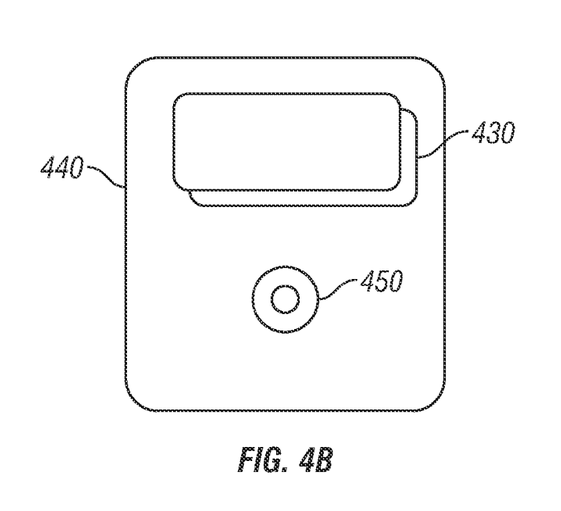
FIG. 4B illustrates an exemplary digital media player that can include a touch sensor with a curved substrate, according to various embodiments described herein.

FIG. 4B illustrates exemplary digital media player 440 that can include a touch screen device 430 and a track pad device 450. The touch screen device 430 and/or the track pad device 450 can include a touch sensor formed with a curved substrate, according to one disclosed embodiment.

Figure 4C:
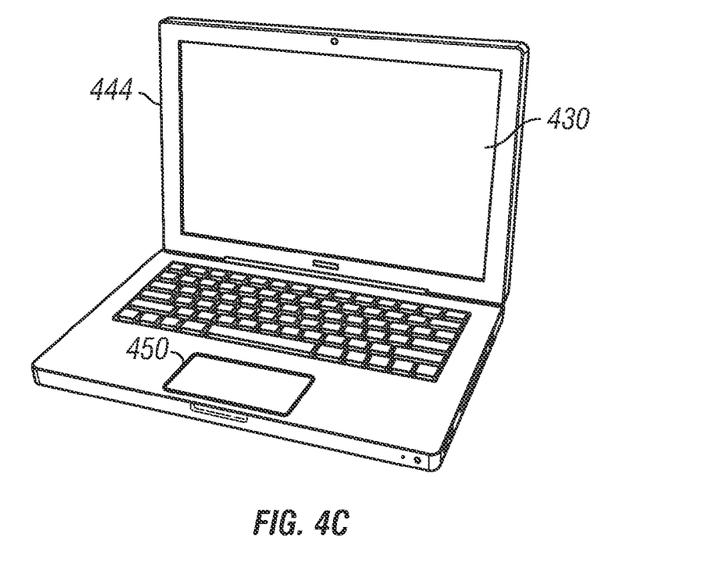
FIG. 4C illustrates exemplary personal computer that can include a touch sensor with a curved substrate, according to various embodiments described herein.

FIG. 4C illustrates exemplary personal computer 444 that can include a display 430, and a track pad 450 including a touch sensor formed with a curved substrate, according to one disclosed embodiment.

Figure 5:
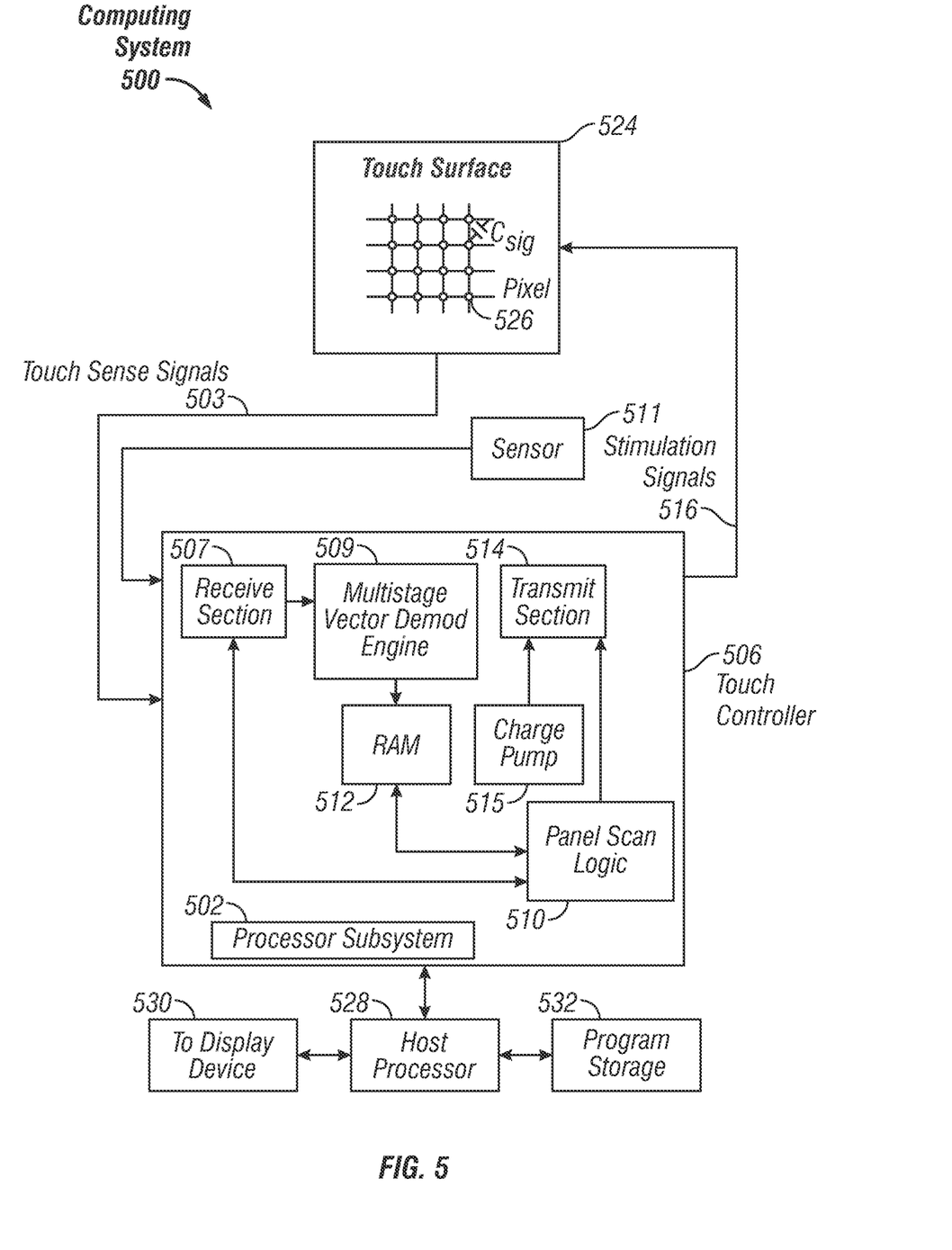
FIG. 5 illustrates an exemplary computing system including one or more touch sensors with curved substrates, according to various embodiments described herein.

FIG. 5 illustrates example computing system 500 including a touch surface 524, which can utilize touch controller 506, according to one embodiment. Any of the embodiments depicted in FIG. 4A, 4B or 4C can be realized with a similar computing system 500. Touch controller 506 can be an ASIC that can include one or more processor subsystems 502, which can include, for example, one or more main (local) processors, such as ARM968 processors or other processors with similar functionality and capabilities. However, in other embodiments, some processor functionality can be implemented instead by dedicated logic, such as a state machine. Processor subsystems 502 can also include, for example, peripherals (not shown) such as random access memory (RAM) or other types of memory or storage, watchdog timers and the like. Touch controller 506 can also include, for example, receive section 507 for receiving signals, such as touch sense signals 503 from sense electrodes (e.g., one or more columns of electrodes) of touch surface 524, and other signals from other sensors such as sensor 511, etc. Of course, any touch sensing mechanism may be implemented, such as mutual capacitance or self capacitance, for example. Charge pump 515 can be used to generate the supply voltage for the transmit section, which can control the drive electrodes (e.g., one or more rows of electrodes). Although FIG. 5 shows charge pump 515 separate from transmit section 514, the charge pump can be part of the transmit section.

Touch controller 506 can also include, for example, a demodulation section such as multistage vector demod engine 509, panel scan logic 510, and a drive system including, for example, transmit section 514. Panel scan logic 510 can access RAM 512, autonomously read data from the sense channels and provide control for the sense channels. In addition, panel scan logic 510 can control transmit section 514 to generate stimulation signals 516 at various frequencies and phases that can be selectively applied to the drive electrodes of touch surface 524.

Touch controller 506 can be adapted to detect the change in mutual capacitance at each of the touch pixels as a finger or other object passes over or contacts the touch surface. Touch controller 506 can be configured to compute the position of finger movement based on the change in mutual capacitance at each of the touch pixels. Touch controller 506 can also be configured to report this information to other logic within touch controller 506, or host processor 528, for example. In non-capacitive embodiments, the touch controller can be adapted in accordance with the touch sensing technology to transmit or receive optical or acoustic wave communications, for example.

While various embodiments have been described above, it should be understood that they have been presented by way of example only, and not by way of limitation. Likewise, the various diagrams may depict an example architectural or other configuration for the disclosure, which is done to aid in understanding the features and functionality that can be included in the disclosure. The disclosure is not restricted to the illustrated example architectures or configurations, but can be implemented using a variety of alternative architectures and configurations. Additionally, although the disclosure is described above in terms of various exemplary embodiments and implementations, it should be understood that the various features and functionality described in one or more of the individual embodiments are not limited in their applicability to the particular embodiment with which they are described. They instead can be applied alone or in some combination, to one or more of the other embodiments of the disclosure, whether or not such embodiments are described, and whether or not such features are presented as being a part of a described embodiment. Thus the breadth and scope of the present disclosure should not be limited by any of the above-described exemplary embodiments.

What is claimed is:

1. A method of forming a curved touch surface, comprising:
   depositing and patterning a conductive thin film on a flexible substrate to form at least one touch sensor pattern, while the flexible substrate is in a flat state and wherein the flexible substrate is a glass substrate;
   supporting the flexible substrate in the flat state on at least one curved forming substrate having a predetermined curvature; and
   performing an anneal process on the conductive thin film, wherein the anneal process causes the flexible substrate to conform to the predetermined curvature of the at least one curved forming substrate.

2. The method of claim 1, wherein the at least one curved forming substrate includes a first forming substrate having a first predetermined curvature and a second forming substrate having a second predetermined curvature complementing the first predetermined curvature.

3. The method of claim 2, further comprising:
   forcing the first and second forming substrates together to facilitate the flexible substrate in conforming to the first and second predetermined curvature.

4. The method of claim 1, further comprising:
   separating the flexible substrate conformed to the predetermined curvature from the at least one curved forming substrate.

5. The method of claim 1, wherein the flexible substrate is formed of at least one of polyethylene-terephthalate (PET), polymide and polycarbonate.

6. The method of claim 1, wherein the thin film forming the touch sensor pattern is at least one of Indium Tin Oxide (ITO), Antimony Tin Oxide (ATO), silver ink, Indium Zinc Oxide (IZO), silver nano wire, CNT and copper.

7. The method of claim 1, wherein the touch sensor is incorporated within a touch sensor panel.

8. The method of claim 7, wherein the touch sensor panel is incorporated within a computing system.

9. The method of claim 7, wherein the touch sensor panel is incorporated within a display device.

10. The method of claim 7, wherein the touch sensor panel is incorporated within a touch mouse device.

11. A method, comprising:
    depositing a patterned conductive thin film on a flexible substrate to form one or more touch sensor patterns, while the flexible substrate is in a flat state and supported by a rigid carrying plate, wherein the flexible substrate is a glass substrate;
    removing the flexible substrate from the rigid carrying plate and supporting the flexible substrate in the flat state on at least one curved forming substrate having a predetermined curvature; and
    performing a heat process on the conductive thin film, wherein the heat causes the flexible substrate to conform to the predetermined curvature of the at least one curved forming substrate.

12. The method of claim 11, wherein the at least one curved forming substrate includes a first forming substrate having a first predetermined curvature and a second forming substrate having a second predetermined curvature complementing the first predetermined curvature.

13. The method of claim 12, further comprising:
    pressing together the first and second forming substrates to force the flexible substrate to conforming to the first and second predetermined curvatures.

14. The method of claim 11, further comprising forming the flexible substrate from at least one of polyethylene-terephthalate (PET), polymide and polycarbonate.

15. The method of claim 11, further comprising depositing the thin film using at least one of Indium Tin Oxide (ITO), Antimony Tin Oxide (ATO), silver ink and copper.

16. The method of claim 11, further comprising incorporating the curved touch surface within a touch sensor panel.

17. The method of claim 16, further comprising incorporating the touch sensor panel within a computing system.

18. The method of claim 16, further comprising incorporating the touch sensor panel within a display device.

19. The method of claim 16, further comprising incorporating the touch sensor panel within a touch mouse device.

\* \* \* \* \*